(12) United States Patent
Fimoff

(10) Patent No.: US 7,277,505 B2
(45) Date of Patent: Oct. 2, 2007

(54) MAPPING ARRANGEMENT FOR DIGITAL COMMUNICATION SYSTEM

(75) Inventor: Mark Fimoff, Hoffman Estates, IL (US)

(73) Assignee: Zenith Electronics Corporation, Lincolnshire, IL (US)

( * ) Notice: Subject to any disclaimer, the term of this patent is extended or adjusted under 35 U.S.C. 154(b) by 727 days.

(21) Appl. No.: 10/840,541

(22) Filed: May 6, 2004

(65) Prior Publication Data

US 2004/0207757 A1 Oct. 21, 2004

Related U.S. Application Data

(62) Division of application No. 09/804,262, filed on Mar. 13, 2001, now Pat. No. 6,958,781.

(60) Provisional application No. 60/255,476, filed on Dec. 13, 2000, provisional application No. 60/198,014, filed on Apr. 18, 2000.

(51) Int. Cl.
*H04L 27/06* (2006.01)
(52) U.S. Cl. ...................................... 375/340
(58) Field of Classification Search ................ 375/260, 375/321, 340–342; 348/21, 555, 720, 725, 348/726
See application file for complete search history.

(56) References Cited

U.S. PATENT DOCUMENTS

| | | | |
|---|---|---|---|
| 4,817,148 A | 3/1989 | Lafferty et al. | |
| 5,087,975 A | 2/1992 | Citta et al. | |
| 5,185,763 A | 2/1993 | Krishnan | |
| 5,285,276 A | 2/1994 | Citta | |
| 5,479,449 A * | 12/1995 | Patel et al. | 375/316 |
| 5,508,748 A | 4/1996 | Krishnamurthy et al. | |
| 5,535,008 A | 7/1996 | Yamagishi et al. | |
| 5,619,497 A | 4/1997 | Gallagher et al. | |
| 5,629,958 A | 5/1997 | Willming | |
| 5,677,911 A | 10/1997 | Fimoff et al. | |
| 5,706,057 A | 1/1998 | Strolle et al. | |
| 5,708,685 A | 1/1998 | Kim | |
| 5,793,756 A | 8/1998 | Ayerst et al. | |
| 5,831,690 A | 11/1998 | Lyons et al. | |
| 5,903,324 A | 5/1999 | Lyons et al. | |
| 5,923,711 A | 7/1999 | Willming | |
| 5,946,298 A | 8/1999 | Okuyama | |
| 5,966,120 A | 10/1999 | Arazi et al. | |
| 6,002,691 A | 12/1999 | Citta et al. | |
| 6,052,208 A | 4/2000 | Lee | |
| 6,084,642 A | 7/2000 | Krishnamurthy | |
| 6,141,384 A | 10/2000 | Wittig et al. | |
| RE36,992 E | 12/2000 | Citta et al. | |
| 6,529,558 B1 | 3/2003 | Fimoff et al. | |
| 7,206,352 B2 * | 4/2007 | Birru et al. | 375/265 |
| 2004/0057535 A1 * | 3/2004 | Strolle et al. | 375/340 |

FOREIGN PATENT DOCUMENTS

EP 0 740 474 B1 7/2002
WO WO 98/51111 11/1998

* cited by examiner

*Primary Examiner*—Khanh C. Tran

(57) ABSTRACT

A receiver receives a digital signal. The digital signal contains a frame of robust VSB data and ATSC data, and the digital signal further contains a map. The map contains information indicating a location of the robust VSB data and ATSC data in the frame. A decoder of the receiver decodes the digital signal. A processor of the receiver processes at least one of the robust VSB data and the ATSC data according to the location information contained in the map.

18 Claims, 12 Drawing Sheets

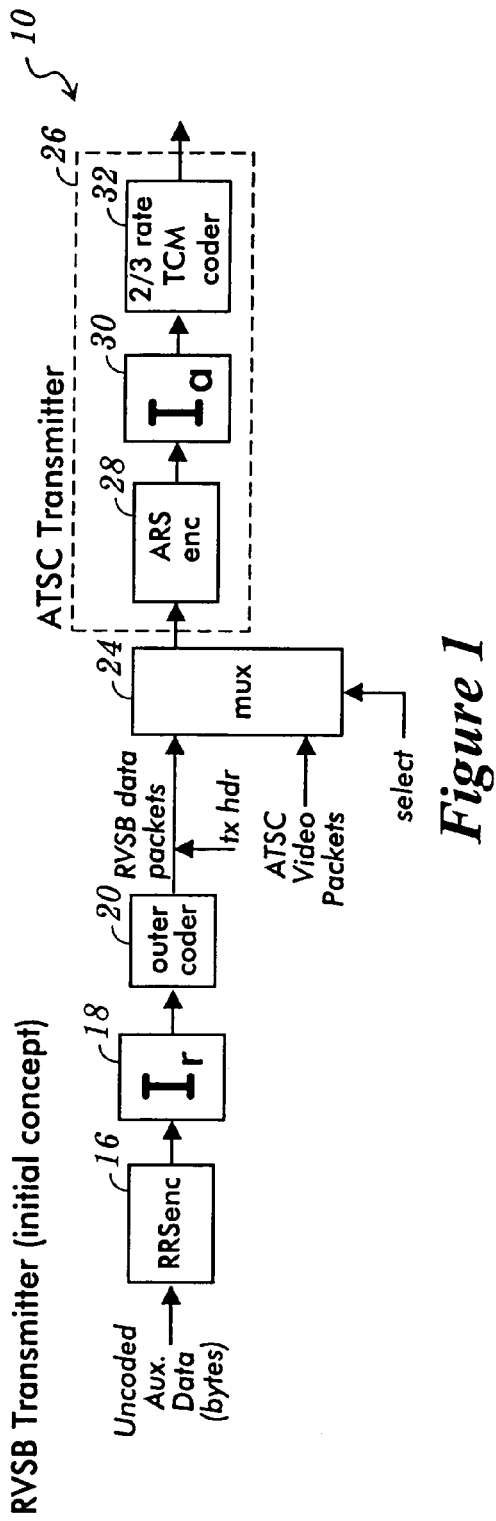
Figure 1
Figure 2
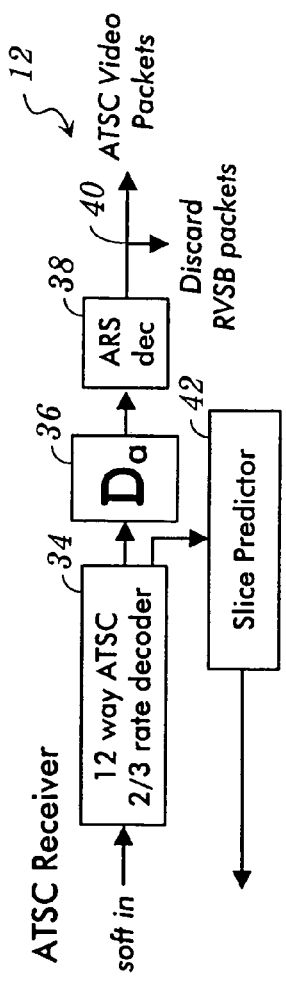
Figure 5

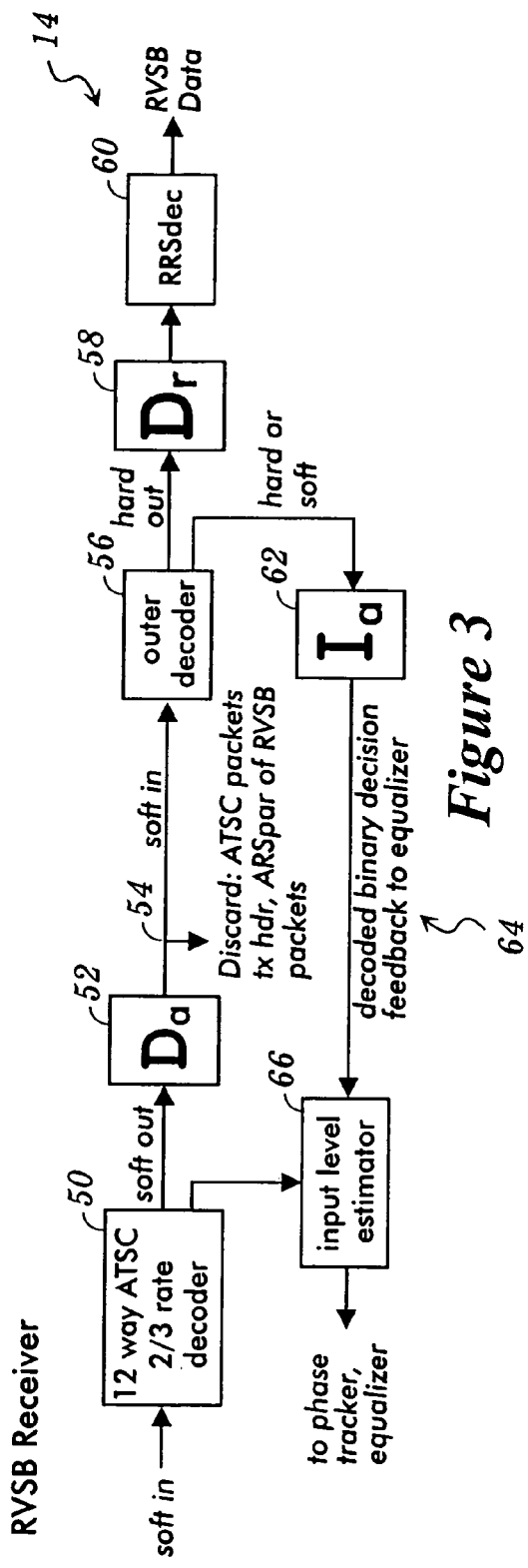
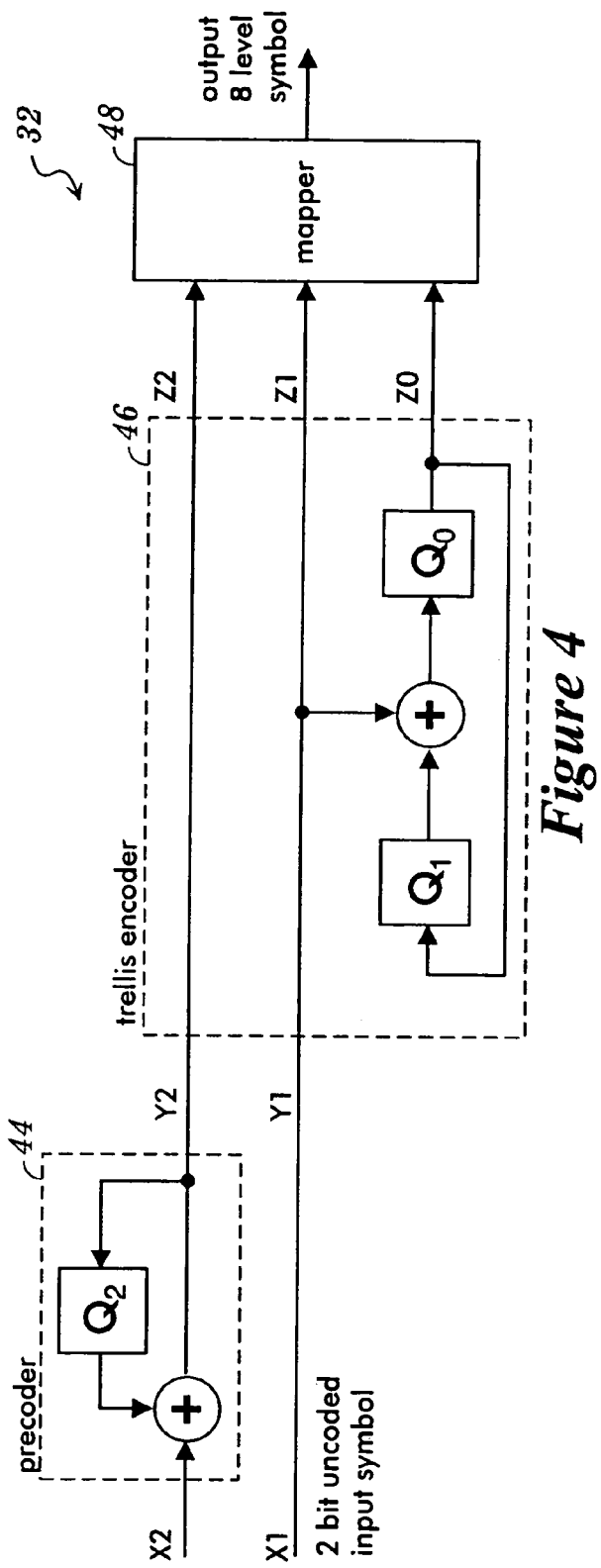
Figure 3
Figure 4

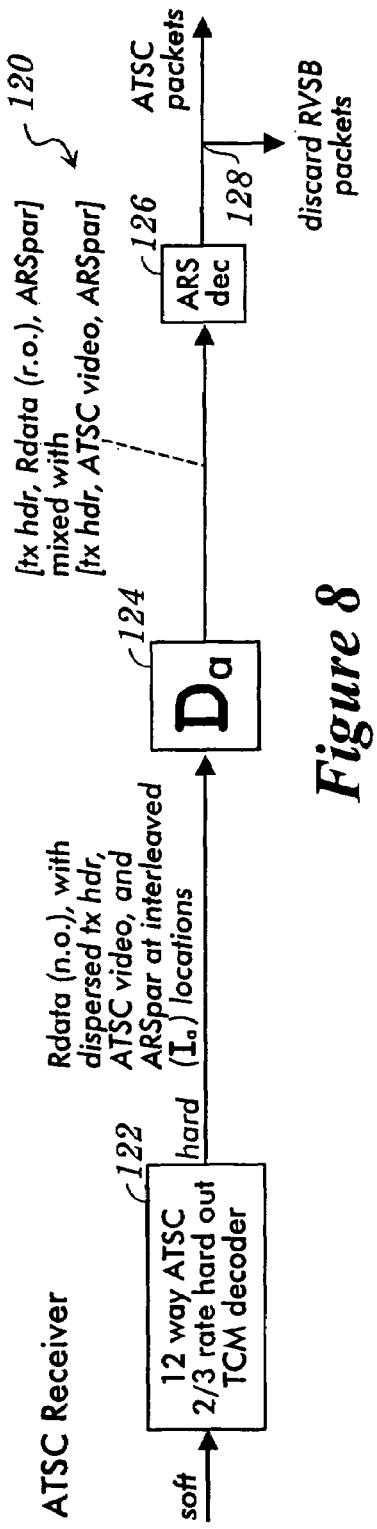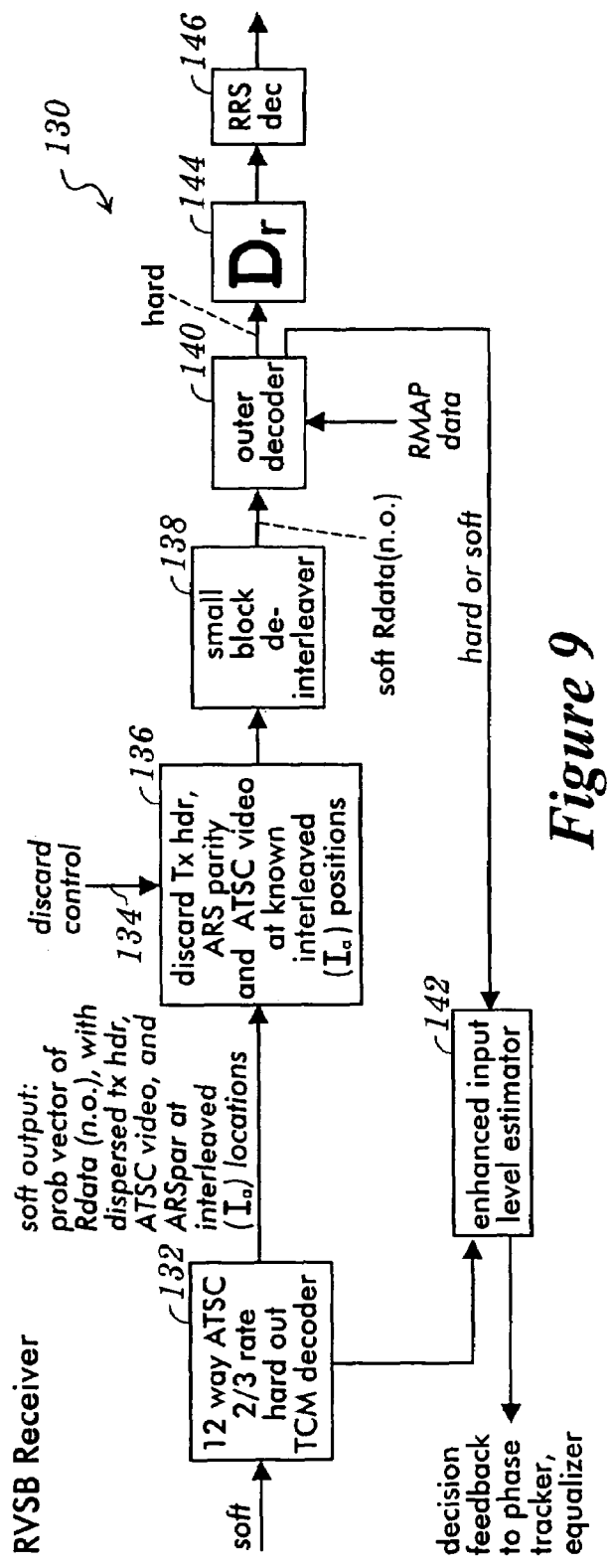
Figure 8
Figure 9 for 1/2 rate outer code

| ATSC tx hdr (12 symbols) | RVSB data (736 symbols) 92 bytes payload | | ARS parity (80 symbols) |
|---|---|---|---|
| ATSC tx hdr (12 symbols) | RVSB data (576 symbols) 72 bytes payload | RRS parity (160 symbols) 20 bytes | ARS parity (80 symbols) |
| ATSC tx hdr (12 symbols) | RVSB data (736 symbols) 92 bytes payload | | ARS parity (80 symbols) |
| ATSC tx hdr (12 symbols) | RVSB data (576 symbols) 72 bytes payload | RRS parity (160 symbols) 20 bytes | ARS parity (80 symbols) |

2 bits/symbol — 1 bit/symbol — 2 bits/symbol

*Figure 12* for 1/4 rate outer code

| ATSC tx hdr (12 symbols) | RVSB data (736 symbols) 46 bytes payload | ARS parity (80 symbols) |
|---|---|---|
| ATSC tx hdr (12 symbols) | RVSB data (736 symbols) 46 bytes payload | ARS parity (80 symbols) |
| ATSC tx hdr (12 symbols) | RVSB data (736 symbols) 46 bytes payload | ARS parity (80 symbols) |
| ATSC tx hdr (12 symbols) | RVSB data (416 symbols) 26 bytes payload | RRS parity (320 symbols) 20 bytes | ARS parity (80 symbols) |

2 bits/symbol — 0.5 bit/symbol — 2 bits/symbol

*Figure 13* for 3/4 rate outer code

| ATSC tx hdr (12 symbols) | RVSB data (736 symbols) 138 bytes payload | ARS parity (80 symbols) |
|---|---|---|
| ATSC tx hdr (12 symbols) | RVSB data (736 symbols) 26 bytes payload \| 20 bytes RRS parity \| 92 bytes payload | ARS parity (80 symbols) |
| ATSC tx hdr (12 symbols) | RVSB data (736 symbols) 72 bytes payload \| 20 bytes RRS parity \| 46 bytes payload | ARS parity (80 symbols) |
| ATSC tx hdr (12 symbols) | RVSB data (736 symbols) 118 bytes payload \| 20 bytes RRS parity | ARS parity (80 symbols) |

2 bits/symbol — 1.5 bit/symbol — 2 bits/symbol

*Figure 14*

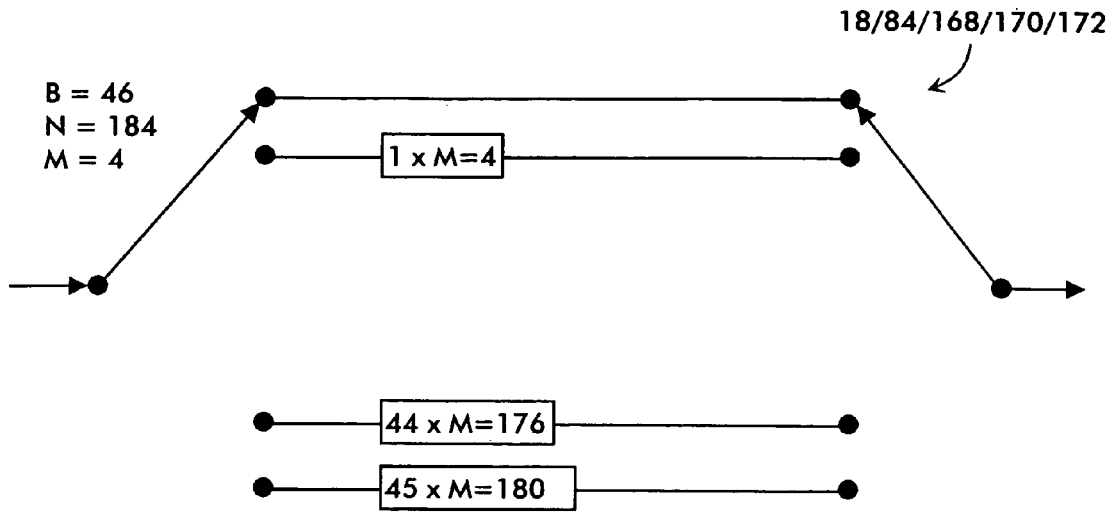
*Figure 15*
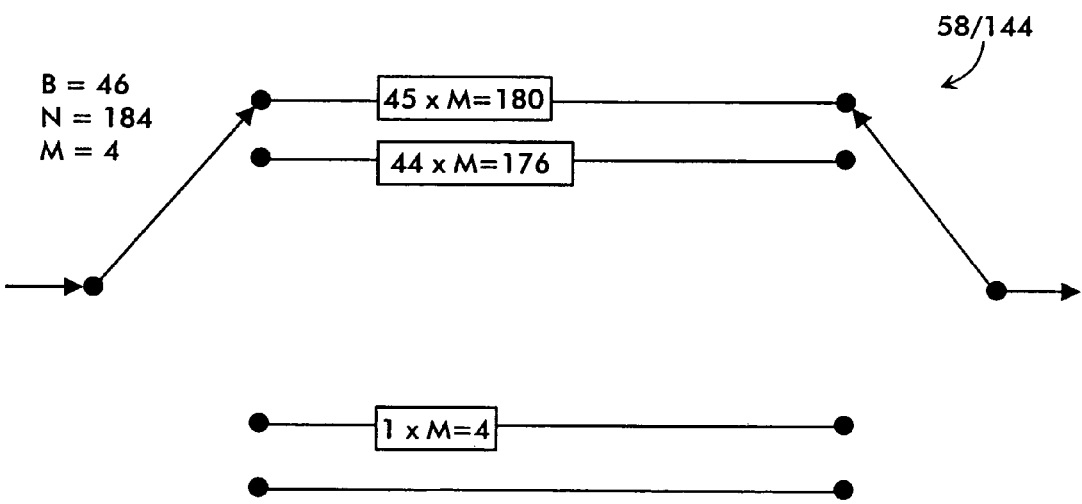
*Figure 16*
First RVSB RS block of field
| RVSB map data (24 bits) | 1288 bits |
|---|---|
*Figure 17*

MAPPING ARRANGEMENT FOR DIGITAL COMMUNICATION SYSTEM

RELATED APPLICATIONS

This application is a divisional of U.S. patent application Ser. No. 09/804,262 which was filed on Mar. 13, 2001 now U.S. Pat. No. 6,958,781 and which claims the benefit of U.S. Provisional Application No. 60/198,014, filed Apr. 18, 2000 and U.S. Provisional Application No. 60/255,476, filed Dec. 13, 2000.

TECHNICAL FIELD OF THE INVENTION

The present invention relates to the transmission and/or reception of digital data.

BACKGROUND OF THE INVENTION

The standard in the United States for the transmission of digital television signals is known as 8 VSB data (ATSC Digital Television Standard A/53). This 8 VSB data has a constellation consisting of eight possible symbol levels. In a VSB system, the eight possible symbol levels are all in the same phase. In a QAM system, however, the symbols are transmitted in phase quadrature relationship.

The standard referred to above specifies the formatting and modulation of digital video and audio data. The transmitted data is in the form of symbols with each symbol representing two bits of data that are trellis encoded into three bits of trellis encoded data. Each three bits of trellis encoded data are mapped into a symbol having a corresponding one of eight levels. Reed/Solomon encoding and interleaving are also provided to increase the robustness of the transmitted information.

Auxiliary data (data other than digital video or audio data) are also permitted to be transmitted in a digital television channel. These data are formatted and modulated according to the standard in the same manner as video and audio data. Receivers made in accordance with the 8 VSB standard are able to read packet identifications (PIDs) which allow the receivers to differentiate between audio, video, and auxiliary data.

However, while the robustness of the transmitted digital television signals is sufficient for digital television reception, this robustness may not be sufficient for the transmission of auxiliary data, particularly where the auxiliary data are critical. Accordingly, one of the applications of the present invention is the transmission of auxiliary data in a VSB format with cuter encoding for added robustness. The auxiliary data transmitted in accordance with the application of the present invention are referred to herein as robust VSB data (RVSB).

SUMMARY OF THE INVENTION

In one aspect of the present invention, a method comprises the following: receiving a digital signal, wherein the digital signal contains robust VSB data, and wherein the digital signal further contains a map permitting a receiver to process the robust VSB data, wherein the robust VSB data contains a duplicate of the map; and, processing the robust VSB data and the duplicate of the map in response to the map.

In another aspect of the present invention, an apparatus comprises a receiver, a decoder, and a processor. The receiver receives a digital signal, and the digital signal contains a frame of first and second 8 VSB data. The first and second 8 VSB data have different bit rates. The digital signal further contains a map, and the map contains information indicating a location of at least one of the first and second 8 VSB data in the frame. The decoder decodes the digital signal. The processor processes the first 8 VSB data according to the location information contained in the map.

In yet another aspect of the present invention, an electrical signal comprises a map, first data symbols, and second data symbols. The first and second data symbols have the same constellation, the first and second data symbols have different bit rates, wherein the first and second data symbols are intermixed in a data frame, and the map contains information indicating a location of at least one of the first and second 8 VSB data in the electrical signal.

In a further aspect of the present invention, an apparatus comprises a receiver, a decoder, and a processor. The receiver receives a digital signal, and the digital signal contains a frame of first and second 8 VSB data. The first and second 8 VSB data have the same constellation, and the first and second 8 VSB data have different bit rates. The digital signal further contains a map, and the map contains information indicating a location of the first 8 VSB data in the frame. The decoder decodes the digital signal. The processor discards the second VSB data and processes the first 8 VSB data.

In still a further aspect of the present invention, an apparatus comprises a receiver and first and second processors. The receiver receives a digital signal, and the digital signal contains a frame of robust VSB data, ATSC data, or both. At least the ATSC data has PID numbers associated therewith. The digital signal further contains a map, and the map contains information indicating a location of the robust VSB data in the frame. The first processor processes the robust VSB data based upon the map. The second processor processes the ATSC data based upon PID numbers.

BRIEF DESCRIPTION OF THE DRAWING

These and other features and advantages will become more apparent from a detailed consideration of the invention when taken in conjunction with the drawing in which:

FIG. 1 shows a robust VSB transmitter for transmitting robust VSB data and ATSC data in accordance with the present invention;

FIG. 2 shows a standard ATSC receiver for receiving the ATSC data transmitted by the robust VSB transmitter of FIG. 1;

FIG. 3 shows a robust VSB receiver for receiving the robust VSB data transmitted by the robust VSB transmitter of FIG. 1;

FIG. 4 shows the ⅔ rate encoder of FIG. 1 in additional detail;

FIG. 5 shows the mapping function performed by the mapper of FIG. 4;

FIG. 8 shows a standard ATSC receiver for receiving the ATSC data transmitted by the robust VSB transmitter of FIG. 7;

FIG. 9 shows a robust VSB receiver for receiving the robust VSB data transmitted by the robust VSB transmitter of FIG. 7;

FIG. 12 shows an example of four data segments containing ½ rate outer coded data that may be transmitted by a robust VSB transmitter according to the present invention;

FIG. 13 shows an example of four data segments containing ¼ rate outer coded data that may be transmitted by a robust VSB transmitter according to the present invention;

FIG. 14 shows an example of four data segments containing ¾ rate outer coded data that may be transmitted by a robust VSB transmitter according to the present invention;

FIG. 15 shows the interleavers ($I_r$) of FIGS. 1, 9, and 11 in more detail;

FIG. 16 shows the deinterleavers ($D_r$) of FIGS. 3 and 9 in more detail;

FIG. 17 shows a map definition structure of a first robust VSB data packet of a frame;

DETAILED DESCRIPTION

Figure 6:
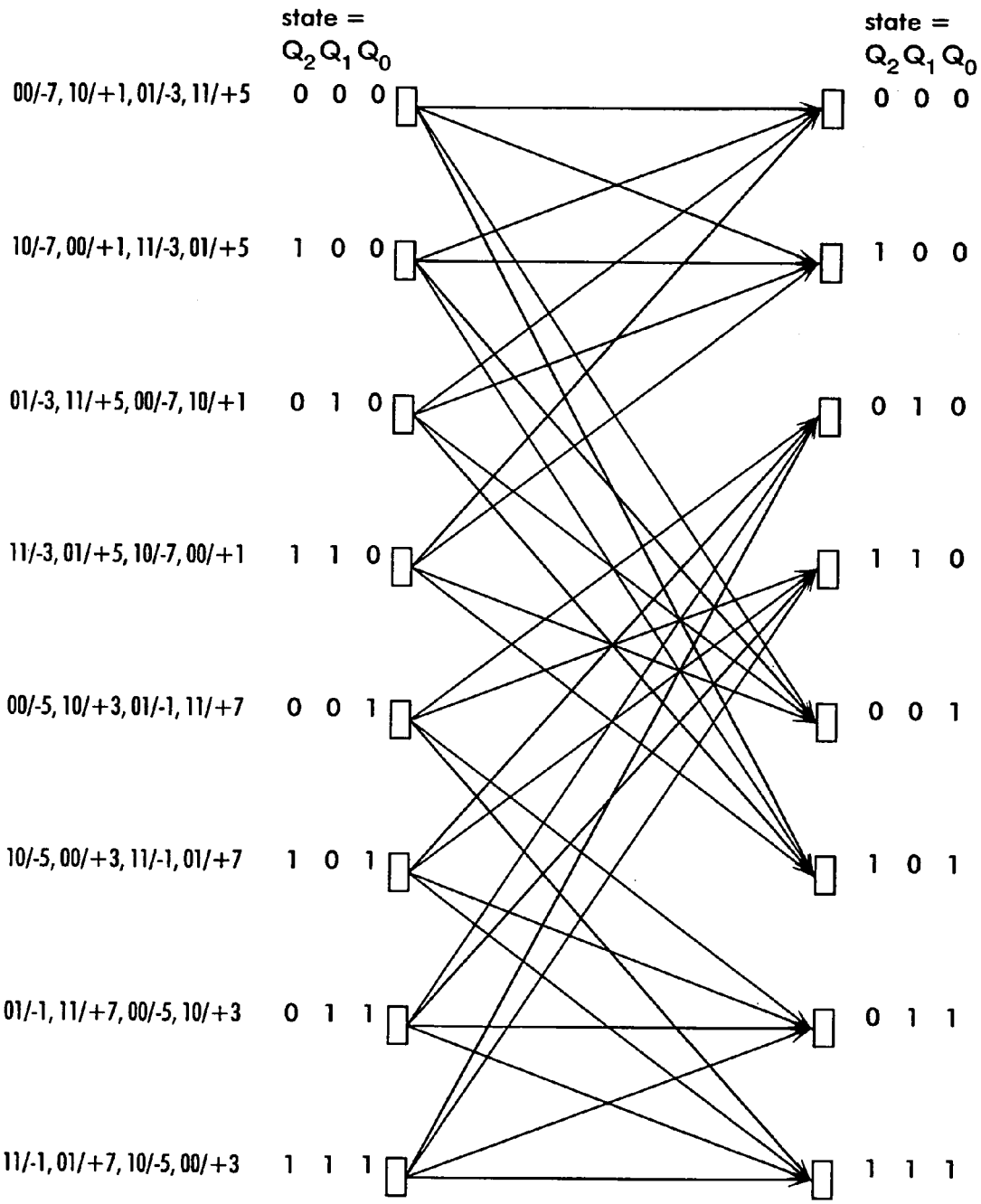
FIG. 6 shows the operation of the ⅔ rate decoders of FIGS. 2 and 3.

RVSB and ATSC Data Transmission and Reception

FIG. 1 shows a robust VSB transmitter 10 that transmits both ATSC data and robust VSB data in accordance with one embodiment of the present invention. FIG. 2 shows a standard ATSC receiver 12 that receives the ATSC data transmitted by the robust VSB transmitter 10, and FIG. 3 shows a robust VSB receiver 14 that receives the robust VSB data transmitted by the robust VSB transmitter 10.

The robust VSB transmitter 10 includes a Reed/Solomon encoder 16 that encodes uncoded auxiliary data bytes by adding Reed/Solomon parity bytes to the uncoded auxiliary data bytes. The uncoded auxiliary data bytes and the Reed/Solomon parity bytes are interleaved by an interleaver 18. Then, the interleaved uncoded auxiliary data bytes and the Reed/Solomon parity bytes are bitwise encoded by an outer coder 20 using either a convolutional code or other error correcting code. The outer coder 20 improves the robustness of the uncoded auxiliary data bytes and the Reed/Solomon parity bytes, converting them to robust data bytes (hereinafter referred to as robust VSB data bytes) and Reed/Solomon parity bytes.

The outer coder 20, for example, may be a ½ rate coder which produces two output bits for every input bit, a ¼ rate coder which produces four output bits for every input bit, or a ¾ rate coder which produces four output bits for every three input bits. Other coders could instead be used.

At the output of the outer coder 20, a three byte transport (tx) header is added to each group of 184 coded robust VSB data and Reed/Solomon bytes to form robust VSB data packets. A multiplexer 24 multiplexes these robust VSB data packets with ATSC data packets (typically, video and audio) each comprising a three byte transport header and 184 bytes of ATSC data. Either input to the multiplexer 24 may be selected on a packet by packet basis and each selected input is supplied to an ATSC transmitter 26. The selection by the multiplexer 24 of which input to pass to the ATSC transmitter 26 is based on a robust VSB map to be described hereinafter.

The ATSC transmitter 26, as is typical, includes a Reed/Solomon encoder 28, an interleaver 30, and a ⅔ rate inner encoder 32 all operating in accordance with the ATSC standard.

A standard ATSC receiver, such as the standard ATSC receiver 12 shown in FIG. 2, receives and processes the ATSC data and discards the robust VSB data. Accordingly, the standard ATSC receiver 12 includes a ⅔ rate inner decoder 34, a deinterleaver 36, and a Reed/Solomon decoder 38, all operating in accordance with the ATSC standard. The standard ATSC receiver 12, however, is programmed to decode both the ATSC data and the robust VSB data transport headers (which include the packet identifications or PID's and. which have not been coded by the outer coder 20). The standard ATSC receiver 12 reads the PID's of all packets and, at 40, discards those packets having the PID's of robust VSB data. The standard ATSC receiver 12 also includes a slice predictor 42 (such as the slice predictor disclosed in U.S. Pat. No. 5,923,711) which is responsive to the inner decoded data and which provides an output back to a phase tracker and/or equalizer, as is known in the art.

The robust VSB data packets can be received, decoded, and processed by a robust VSB receiver such as the robust VSB receiver 14 shown in FIG. 3. As is known, and as shown in FIG. 4, the ⅔ rate inner encoder 32 of the ATSC transmitter 26 includes a precoder 44 and a four state trellis encoder 46. In combination, the precoder 44 and the four state trellis encoder 46 may be viewed as an eight state coder that produces three trellis encoded output bits (Z0 Z1 Z2) for every two input bits (X1 X2). A mapper 48 maps the three trellis encoded output bits to a symbol having one of eight levels as shown in FIG. 5. As is well known from convolutional code theory, the operation of the precoder 44 and the four state trellis encoder 46 may be viewed as an eight state 4-ary trellis.

Therefore, in the robust VSB receiver 14, a ⅔ rate inner decoder 50 may operate on an eight state 4-ary trellis which views the precoder 44 and the four state trellis encoder 46 of the ⅔ rate inner encoder 32 in combination as shown in FIG. 6 to produce a soft output decision (using, for example, the SSA algorithm as described in "Optimum Soft Output Detection for Channels with Intersymbol Interference," Li, Vucetic, and Sato, IEEE Transactions on Information Theory, May, 1995). This soft decision making operation is more complicated than the widely used Viterbi algorithm, which produces a hard decision output, but the soft decision making operation more fully takes advantage of the coding gain provided by the outer coder 20.

The output of the ⅔ rate inner decoder 50 is deinterleaved by a deinterleaver 52. The robust VSB receiver 14 reads the PID's of all packets at the output of the deinterleaver 52. Based upon these PID's, the robust VSB receiver 14 discards those packets at 54 which have the PID's of ATSC data and also discards the transport headers added following the outer coder 20 and the parity bytes added by the Reed/Solomon encoder 28. Thus, the robust VSB receiver 14, at 54, passes only the robust VSB data packets containing the robust VSB data coded by the outer coder 20. The robust VSB data packets are decoded by an outer decoder 56, deinterleaved by a deinterleaver 58 (which is the inverse of the interleaver 18), and Reed/Solomon decoded by a Reed/

Solomon decoder 60 in order to reconstruct the original uncoded auxiliary data supplied to the Reed/Solomon encoder 16 of FIG. 1.

The reliable output of the outer decoder 56 (either soft or hard output may be used) is interleaved by an interleaver 62 (corresponding to the interleaver 30) in a feedback path 64 in order to restore the ordering of the outer decoded data to the order of the data in the channel. This interleaved outer decoded data can be used, for example, by a slice predictor 66 to create reliable feedback to a phase tracker and/or equalizer. However, the overall feedback delay introduced by the deinterleaver 52 and the interleaver 62 in the robust VSB receiver 14 is generally too long to provide useful feedback to the phase tracker and/or equalizer.

Figure 7:
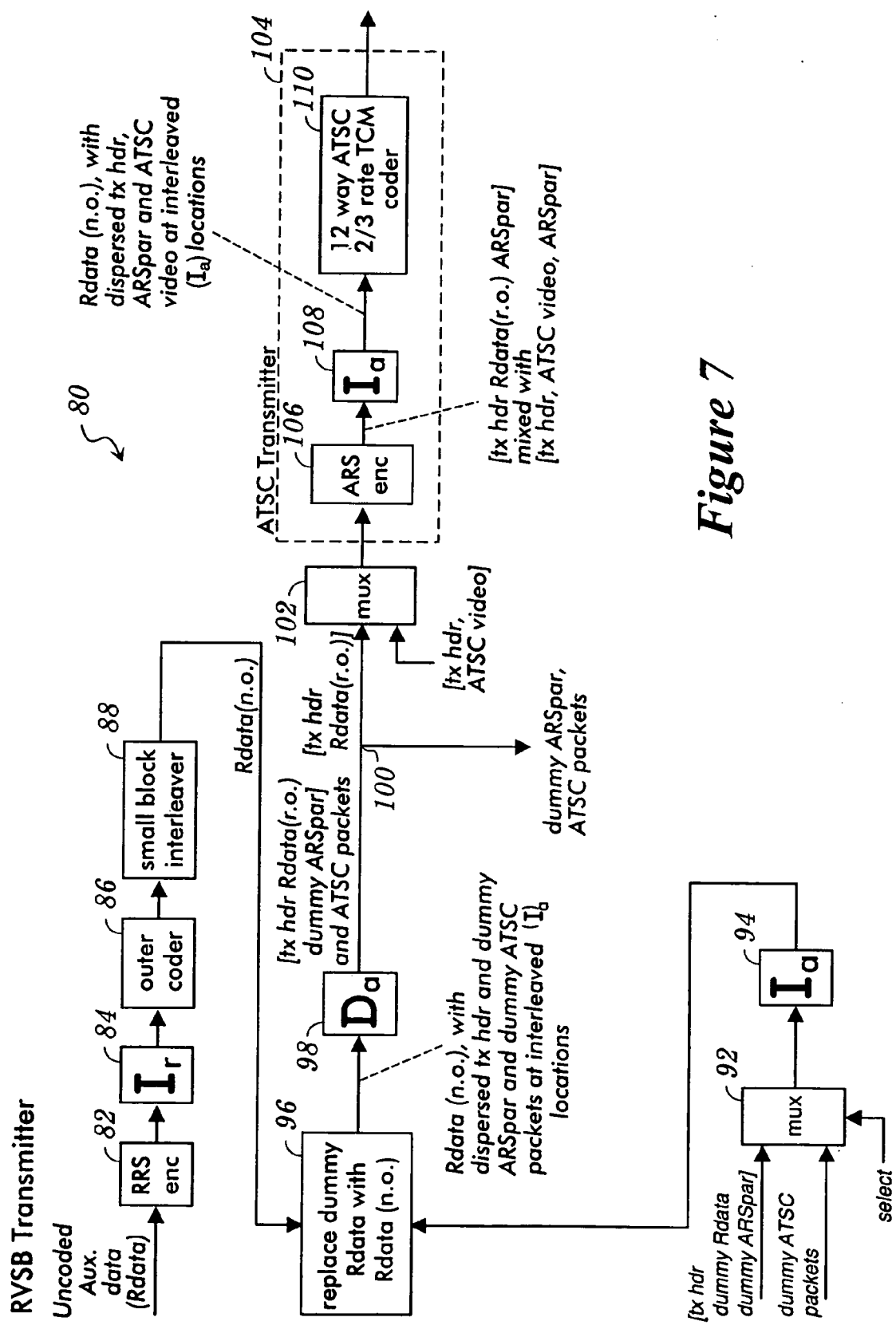
FIG. 7 shows another robust VSB transmitter for transmitting robust VSB data and ATSC data in accordance with the present invention.

The arrangement shown in FIGS. 7, 8, and 9 avoids the feedback delay introduced by the deinterleaver 52 and the interleaver 62 of the robust VSB receiver 14. FIG. 7 shows a robust VSB transmitter 80 in which uncoded auxiliary data bytes are encoded by a Reed/Solomon encoder 82 which adds Reed/Solomon parity bytes to the uncoded auxiliary data bytes. The uncoded auxiliary data bytes and the Reed/Solomon parity bytes are interleaved by an interleaver 84. Then, the interleaved uncoded auxiliary data bytes and Reed/Solomon parity bytes are bitwise encoded by an outer coder 86 using either a convolutional code or a turbo product code, as discussed above. The bitwise output of the outer coder 86 is small block interleaved by a small block interleaver 88 in order to reduce the impact of channel burst errors on the outer decoding. The data provided by the small block interleaver 88 may be referred to as Rdata(n.o.) which stands for normally ordered robust VSB data.

One input of a first multiplexer 92 receives ATSC formatted packets each comprising (i) a valid three byte transport header with a PID number for robust VSB data, (ii) 184 placeholder bytes of dummy robust VSB data, and (iii) twenty placeholder bytes for dummy ATSC Reed/Solomon parity data. The other input of the first multiplexer 92 receives ATSC formatted dummy packets each comprising 207 bytes of dummy ATSC data. These ATSC formatted dummy packets serve as placeholders for the real ATSC packets to be added downstream. The inputs of the first multiplexer 92 may be selected on a packet by packet basis, and this selection is based on the robust VSB map to be described later.

The selected output of the first multiplexer 92 is interleaved by an interleaver 94 according to the ATSC Standard for the convolutional byte interleave. A data replacer 96 receives both the output of the interleaver 94 and the output of the small block interleaver 88. The data replacer 96 replaces each dummy robust VSB data placeholder byte from the interleaver 94 with the next normally ordered robust VSB data byte from the small block interleaver 88.

The output of the data replacer 96 contains normally ordered robust VSB data with interspersed transport headers, dummy ATSC Reed/Solomon parity bytes, and dummy ATSC data packet bytes. A deinterleaver 98, which operates according to the ATSC Standard for byte deinterleaving, deinterleaves the output of the data replacer 96 to thus effectively "repacketize" the data as packets of transport headers, reordered robust VSB data (Rdata(r.o.)), dummy ATSC Reed/Solomon parity bytes, and dummy ATSC data. The reordering of the normally reordered robust VSB data results from the deinterleaving of the deinterleaver 98 and the reordered data may be referred to as reordered robust VSB data.

The dummy ATSC Reed/Solomon parity bytes (20 per packet) of the robust VSB packets and the dummy ATSC data packets (207 bytes per packet) are discarded at 100. The remaining robust VSB packets, each including a transport header and reordered robust VSB data, are multiplexed by a second multiplexer 102 with real ATSC data packets each containing 187 bytes of a transport header and ATSC data. Either input to the second multiplexer 102 may be selected on a packet by packet basis and is supplied to an ATSC transmitter 104. The selection by the second multiplexer 102 of which input to pass to the ATSC transmitter 104 is based on the robust VSB map to be described hereinafter.

The ATSC transmitter 104 typically includes a Reed/Solomon encoder 106, an interleaver 108, and a twelve way ⅔ rate inner encoder 110 all operating in accordance with the ATSC standard. The Reed/Solomon encoder 106 outputs packets of transport headers, reordered robust VSB data, and ATSC Reed/Solomon parity bytes multiplexed with packets of transport headers, ATSC data, and ATSC Reed/Solomon parity bytes. The ATSC Reed/Solomon parity bytes for the robust VSB data are calculated based on the reordered robust VSB data. Moreover, the interleaver 108 changes the ordering of the robust VSB data so that the robust VSB data at the output of the interleaver 108 is again normally ordered robust VSB data. Also, the interleaver 108 disperses the transport headers, the ATSC Reed/Solomon parity bytes, and the ATSC data. This data is ⅔ rate coded by the twelve way ⅔ rate inner encoder 110 and is transmitted. The transmitted robust VSB data is in normal order, i.e., the order provided at the output of the small block interleaver 88. This normal order permits the robust VSB receiver to avoid the delay caused by the deinterleaver 52 and the interleaver 62 of the robust VSB receiver 14.

As shown in FIG. 8, a standard ATSC receiver 120 includes a twelve way ⅔ inner decoder 122 which decodes the transmitted data to provide an output data stream comprising normally ordered robust data with interspersed transport headers, ATSC data, and ATSC Reed/Solomon parity bytes located according to the ATSC convolutional byte interleave provided by the interleaver 108. An ATSC deinterleaver 124 restores the transport headers, ATSC data, and ATSC Reed/Solomon parity bytes to their transport "packetized" positions. Also, the ATSC deinterleaver 124 converts the normally ordered robust VSB data into reordered robust VSB data. This reordered form permits an ATSC Reed/Solomon decoder 126 of the standard ATSC receiver 120 to correctly test parity for the robust VSB data packets. The standard ATSC receiver 120 can then read the robust VSB data packet transport headers and gracefully discard the robust VSB data packets at 128 based on their PIDs.

As shown in FIG. 9, a robust VSB receiver 130 includes a soft output twelve way ⅔ rate inner decoder 132. (A hard output ⅔ decoder would result in a considerable loss of coding gain). The output of the soft output twelve way ⅔ rate inner decoder 132 comprises normally ordered robust VSB data, with reordered ATSC data, transport headers, and ATSC Reed/Solomon parity symbols dispersed within the robust VSB data at locations indicated by a discard control line 134 discussed below. A discard block 136, under control of the discard control line 134, discards the reordered ATSC data, transport headers, and ATSC Reed/Solomon parity symbols.

A small block deinterleaver 138 deinterleaves the robust VSB data. The small block deinterleaver 138 has a relatively low delay time. This deinterleaving disperses possible burst errors in the robust VSB data at the output of the soft output twelve way ⅔ rate inner decoder 132. The normally ordered robust VSB data is bitwise decoded by an outer decoder 140 which also packs the robust VSB data into bytes. The amp information telling the outer decoder 140 what decoding rate to use on what data is provided to the outer decoder 140 at an $R_{MAP}$ Data input. Neither the deinterleaver 52 nor the interleaver 62 is needed in the robust VSB receiver 130 allowing for lower overall feedback delay to the phase tracker and/or equalizer. The outer decoded data can be used, for example, by an enhanced slice predictor 142 to generate feedback to the phase tracker and/or equalizer. If desired, the feedback may be gated, or the step size of the equalizer gradient algorithm adjusted proportionally to the reliability of the decoded data.

The robust VSB data packet payload decoded by the outer decoder 140 is deinterleaved by a deinterleaver 144 (which is the inverse of the interleaver 84) and is Reed/Solomon decoded by a Reed/Solomon decoder 146 (corresponding to the Reed/Solomon encoder 82) in order to reconstruct the original uncoded auxiliary data supplied to the Reed/Solomon encoder 82 of FIG. 7.

As provided in the ATSC standard, a frame comprises a plurality of segments each containing a predetermined number of bytes. The first segment of a frame is a frame sync segment, and the remaining segments in the frame are data segments. Although robust VSB data can be transmitted in segments or in partial segments, it is convenient to transmit robust VSB data in segment pairs. The robust VSB map discussed above indicates which segment pairs contain robust VSB data so that the discard block 136 can correctly discard the reordered ATSC data before the reordered ATSC data can get to the outer decoder 140. The transport headers and the ATSC Reed/Solomon parity data for all segments (robust VSB and ATSC) must also be discarded by the discard block 136.

Figure 10:
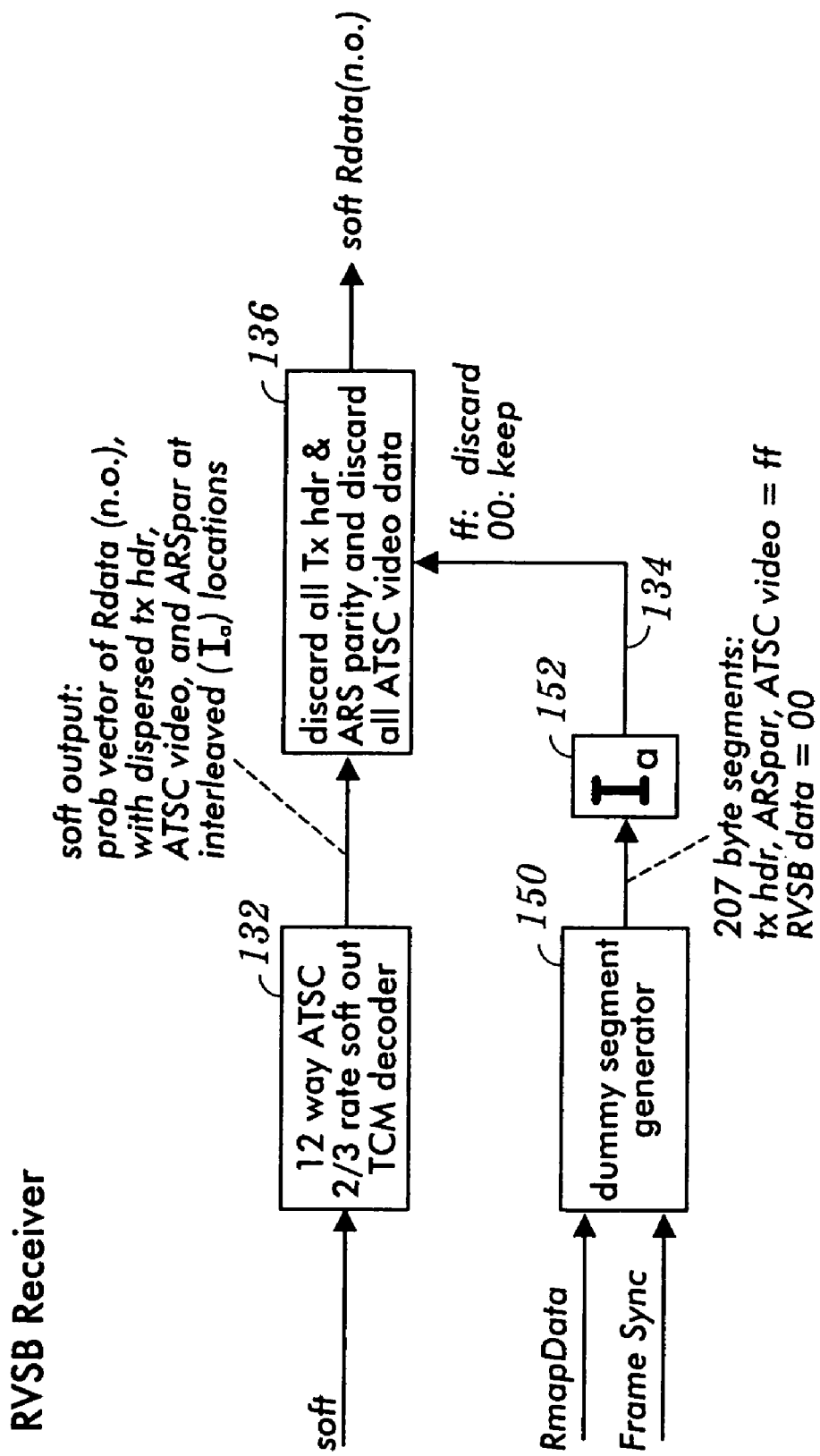
FIG. 10 shows a circuit for generating the appropriate control signal on the discard control line of FIG. 9.

A conceptually simple circuit to generate the appropriate control signal on the discard control line 134 to control this discarding function is shown in FIG. 10, together with the relevant portion of the robust VSB receiver 130. The robust VSB receiver 130 uses received map information (the method for transmission and reception of this map information is described below) to instruct a dummy segment generator 150 when to construct dummy 207 byte segments. The dummy segment generator 150 also uses the frame sync signal. For each ATSC dummy segment, the dummy segment generator 150 sets all bytes to FF. For each robust VSB data dummy segment, the dummy segment generator 150 sets the transport header and ATSC Reed/Solomon parity bytes to FF. The dummy segment generator 150 sets the rest of the bytes of each robust VSB data dummy segment to 00.

These dummy segments are fed by the dummy segment generator 150 to an ATSC convolutional byte interleaver 152 whose output is then used to control the discard block 136 which then responds to the FF and 00 codes to correctly discard the reordered ATSC data, the transport headers, and the ATSC Reed/Solomon parity data which are interleaved within the received data stream. The discard block 136, thus, passes only the robust VSB data.

Figure 11:
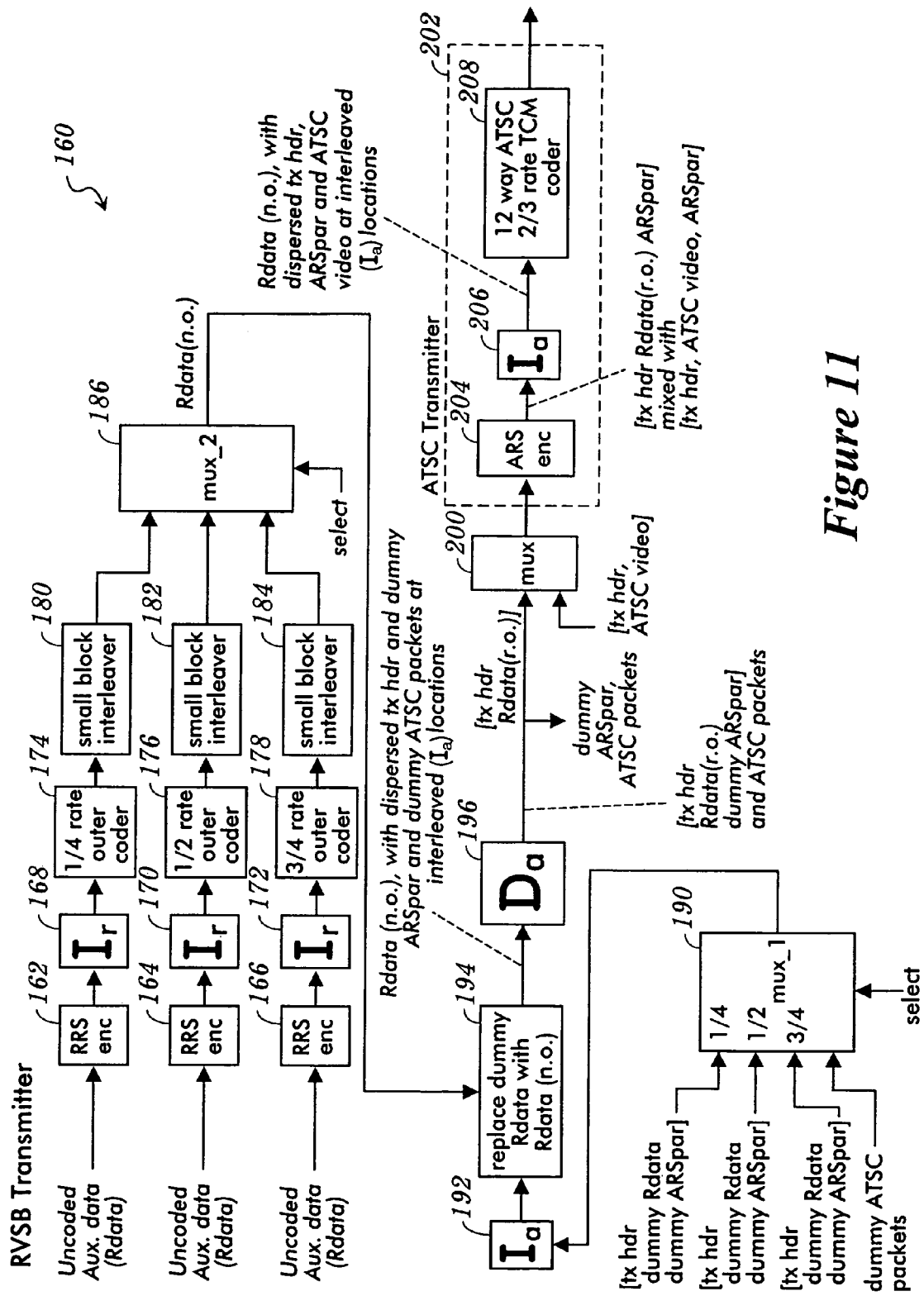
FIG. 11 shows yet another robust VSB transmitter for transmitting robust VSB data and ATSC data in accordance with the present invention.

FIG. 11 shows a multiple outer code robust VSB transmitter 160. The robust VSB transmitter 160 operates similarly to the robust VSB transmitter 80 of FIG. 7. The robust VSB transmitter 160 has a first Reed/Solomon encoder 162 which encodes first uncoded auxiliary data by adding Reed/Solomon parity bytes to the first uncoded auxiliary data, a second Reed/Solomon encoder 164 which encodes second uncoded auxiliary data by adding Reed/Solomon parity bytes to the second uncoded auxiliary data, and a third Reed/Solomon encoder 166 which encodes third uncoded auxiliary data bytes by adding Reed/Solomon parity bytes to the third uncoded auxiliary data. The Reed/Solomon encoded first uncoded auxiliary data are interleaved by a first interleaver 168, the Reed/Solomon encoded second uncoded auxiliary data are interleaved by a second interleaver 170, and the Reed/Solomon encoded third uncoded auxiliary data are interleaved by a third interleaver 172. Then, the interleaved Reed/Solomon encoded first uncoded auxiliary data are bitwise encoded by a first outer coder 174, the interleaved Reed/Solomon encoded second uncoded auxiliary data are bitwise encoded by a second outer coder 176, and the interleaved Reed/Solomon encoded third uncoded auxiliary data are bitwise encoded by a third outer coder 178. The bitwise output of the first outer coder 174 is interleaved by a first small block interleaver 180, the bitwise output of the second outer coder 176 is interleaved by a second small block interleaver 182, and the bitwise output of the third outer coder 178 is interleaved by a third small block interleaver 184.

The first outer coder 174 is a ¼ rate coder, the second outer coder 176 is a ½ rate coder, and the third outer coder 178 is a ¾ rate coder, although any other combination of these or other outer coders using different coding rates could be used. The data outputs of the first, second, and third small block interleavers 180, 182, and 184 are selected by a multiplexer 186 under control of a select input which determines the order in which the differently outer coded data are inserted into the frame to be transmitted. The data at the output of the multiplexer 186 may be referred to as Rdata(n.o.) which, as before, stands for normally ordered robust VSB data.

The top three inputs of a multiplexer 190 receive ATSC format packets each having of a valid three byte transport header with a PID number for robust VSB data, 184 placeholder bytes of dummy robust VSB data, and twenty dummy placeholder bytes for ATSC Reed/Solomon parity data. The robust VSB data at the topmost input of the multiplexer 190 correspond to ¼ rate coded data from the first outer coder 174, the robust VSB data at the next input of the multiplexer 190 correspond to ½ rate coded data from the second outer coder 176, and the robust VSB data at the next input of the multiplexer 190 correspond to ¾ rate coded data from the third outer coder 178. The data supplied to the bottommost input of the multiplexer 190 comprises ATSC format dummy packets each having 207 bytes of dummy ATSC data. These dummy ATSC data packets serve as placeholders for the real ATSC data packets to be added downstream of the multiplexer 190. The inputs to the multiplexer 190 may be selected on a packet by packet basis in accordance with the input on a select line. This selection is based on the robust VSB data map to be described below.

The output of the multiplexer 190 is interleaved by an interleaver 192 in order to achieve a correct ATSC convolutional interleave. A data replacer 194 receives both the output of the interleaver 192 and the output of the multiplexer 186. The data replacer 194 replaces each dummy robust VSB data placeholder byte from the multiplexer 190 with the next corresponding normally ordered robust VSB data byte from the multiplexer 186.

The output of the data replacer 194 contains normally ordered robust VSB data (which is ¼ rate coded, ½ rate coded, and/or ¾ rate coded, as appropriate) with interspersed transport headers, dummy ATSC Reed/Solomon parity bytes, and dummy ATSC data packet bytes. A convolutional byte deinterleaver 196 (as described in the ATSC Standard) deinterleaves the output of the data replacer 194 to thus effectively "repacketize" the data as packets of transport headers, reordered robust VSB data (¼, ½, and/or ¾ rate coded), dummy ATSC Reed/Solomon parity bytes, and dummy packets of ATSC data. The reordering of the normally ordered robust VSB data results from the deinterleaving of the deinterleaver 196.

The dummy ATSC Reed/Solomon parity bytes (20 per packet) and the dummy ATSC data packets (207 bytes per packet) are discarded at 198 in a manner similar to that provided by the discard control line 134 and the discard block 136 of FIG. 9. The remaining robust VSB packets, each including a transport header and reordered robust VSB data, are multiplexed by a multiplexer 200 with real ATSC data packets each containing 187 bytes of a transport header and ATSC data. Either input to the multiplexer 200 may be selected on a packet by packet basis and is supplied to an ATSC transmitter 202. The selection by the multiplexer 200 of which input to pass to the ATSC transmitter 202 is based on the robust VSB map to be described hereinafter.

The ATSC transmitter 202 typically includes a Reed/Solomon encoder 204, an interleaver 206, and a twelve way ⅔ rate inner encoder 208 all operating in accordance with the ATSC standard. The Reed/Solomon encoder 204 outputs packets of transport headers, reordered robust VSB data, and ATSC Reed/Solomon parity bytes multiplexed with packets of transport headers, ATSC data, and ATSC Reed/Solomon parity bytes. The ATSC Reed/Solomon parity bytes for the robust VSB data are calculated based on the reordered robust VSB data. Moreover, the interleaver 206 changes the ordering of the robust VSB data so that the robust VSB data at the output of the interleaver 206 are again normally ordered robust VSB data. Also, the interleaver 206 disperses the transport header bytes, the ATSC Reed/Solomon parity bytes, and the ATSC data. These data are ⅔ rate coded by the twelve way ⅔ rate inner encoder 208 and are transmitted. The transmitted robust VSB data are in normal order, i.e., the order provided at the output of the multiplexer 186. This normal data order permits the robust VSB receiver to avoid the delay caused by the deinterleaver 52 and the interleaver 62.

As discussed above, an ATSC frame comprises a frame sync segment and a plurality of data segments and, for convenience, robust VSB data are packed into groups of four segments. More specifically, FIG. 12 shows an example of four data segments that may be used in a frame to transmit robust VSB data that is ½ rate coded, FIG. 13 shows an example of four data segments that may be used in a frame to transmit robust VSB data that is ¼ rate coded, and FIG. 14 shows an example of four data segments that may be used in a frame to transmit robust VSB data that is ¾ rate coded. These examples represent the frame prior to the interleaver 108 and assume that each group of four robust VSB data segments contains an integral number of robust Reed/Solomon encoded blocks each of which is 184 bytes long, of which twenty bytes are parity bytes.

For the case of a ½ rate outer code, FIG. 12 shows that the outer coder outputs two bits for each input bit. A robust VSB data packet is packed as one RVSB Reed-Solomon block to a pair of data segments (one bit per symbol) so that, for a ½ rate outer code, four segments contain two robust Reed/Solomon encoded blocks. As shown in FIG. 13, for the case of a ¼ rate outer code, the outer coder outputs four bits for each input bit. Robust VSB data is packed as one RVSB Reed-Solomon block for every four data segments (½ bit per symbol) so that, for a ¼ rate outer code, four segments contain one Reed/Solomon encoded block. As shown in FIG. 14, for the case of a ¾ rate outer code, the outer coder outputs four bits for each three input bits. In this case, transmitted symbol and byte boundaries do not always match. However, three complete RVSB Reed-Solomon blocks will pack exactly into four data segments (1.5 bits per symbol) so that, for a ¾ rate outer code, four segments contain three robust Reed/Solomon encoded blocks.

Accordingly, FIGS. 12, 13, and 14 can be represented by the following table:

| S   | X | Y |
|-----|---|---|
| 1/2 | 1 | 2 |
| 1/4 | 2 | 4 |
| 3/4 | 3 | 4 | where X represents the number of complete robust Reed/Solomon encoded blocks and Y represents the number of frame segments required to contain the corresponding number X of robust Reed/Solomon encoded blocks.

However, it should be understood that other coding rates can be used in conjunction with the present invention and, therefore, the above table will change depending upon the particular coding rates that are used.

The interleavers 18, 84, 168, 170, and 172 are shown in more detail in FIG. 15, and the deinterleavers 58 and 144 are shown in more detail in FIG. 16, assuming that a robust Reed/Solomon encoded block is chosen to be 184 bytes long. The interleavers 18, 84, 168, 170, and 172 are B=46, M=4, N=184 convolutional interleavers that byte wise interleave the robust VSB data. This interleaving scheme is the same as the ATSC interleaver scheme described in the ATSC Digital Television Standard A/53 and the Guide to the Use of the ATSC digital Television Standard A/54, except that the B parameter for the robust interleaver is 46 instead of 52 and the parameter N is 184 instead of 208. This interleaver is needed so that a robust VSB receiver can cope with long bursts of noise on the channel even though the ATSC deinterleaver ($D_a$) is bypassed as shown in FIG. 9.

As shown in FIG. 16, the deinterleavers 58 and 144 are B=46, M=4, N=184 convolutional deinterleavers that byte wise deinterleave the robust VSB data. This deinterleaving scheme is also the same as the ATSC deinterleaver scheme described in the ATSC Digital Television Standard A/53 and the Guide to the Use of the ATSC digital Television Standard A/54, except that the B parameter for the robust deinterleaver is 46 instead of 52 and the parameter N is 184 instead of 208.

Because a robust VSB Reed/Solomon block comprises 184 bytes, and because an integral number of robust VSB Reed/Solomon blocks are in a data frame, the number of robust VSB data bytes plus robust VSB Reed/Solomon parity bytes in a data frame is always evenly divisible by 46. Therefore, the frame sync segment can be used as a synchronizer for the deinterleavers 58 and 144 ($D_r$) in the receiver, regardless of the value of G (to be described below). At frame sync, the deinterleaver commutators are forced to the top positions. The deinterleavers 58 and 144 are byte wise deinterleavers.

Data Mapping

As discussed above, each data frame may contain a mix of robust VSB data segments and ATSC (non-robustly coded) data segments. Moreover, the robust VSB data may contain data coded with a mix of coding rates. The robust VSB receiver 14 or 130 must have a robust VSB map that indicates which segments are robust VSB coded and which outer code is used for the robust VSB coding so that the robust VSB receiver 14 or 130 can correctly process the robust VSB data and discard the ATSC data. The robust VSB transmitters 10, 80, and 160 also use the robust VSB map to control their corresponding multiplexing and discard functions. This robust VSB map is transmitted by the robust VSB transmitter 10, 80, or 160 to the robust VSB receiver 14 or 130 along with all the other data in a manner described below.

Figure 18:
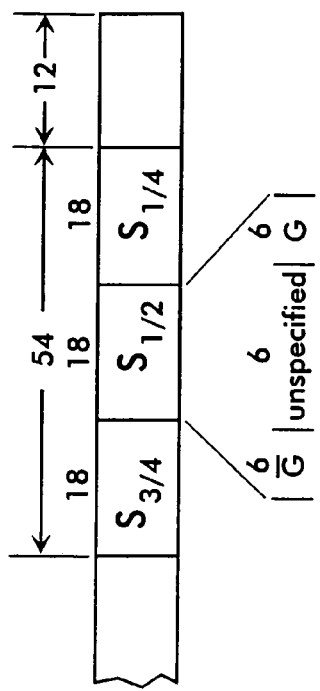
FIG. 18 shows a portion of the frame sync segment of a frame that carries a map indicating where in the frame robust VSB data can be found.

The presence, amount, and location of the robust VSB data in a data frame encoded with a particular outer code are indicated by one or more numbers $S_C$ that appear as two level data in the frame sync segment of the data frame. As is known, the frame sync segment is the first segment in a frame. So, for the outer codes described above (¼ rate, ½ rate, and ¾ rate), the frame sync segment should preferably contain $[S_{1/4}\ S_{1/2}\ S_{3/4}]$. Each $S_c$ (such as $S_{1/4}$ or $S_{1/2}$ or $S_{3/4}$) is encoded as eighteen symbols (bits) of two level data. For all three codes, a total of 3×18=54 symbols are needed as a definition of the robust VSB map. These symbols are inserted into the reserved area near the end of each frame sync segment (just before the twelve preceding bits). For each group of eighteen bits ($b_{18}\ \ldots\ b_1$), the last six bits ($b_6\ \ldots\ b_1$) represent the number G of groups of eight segments (8 segments=2, 4 or 6 robust VSB data packets depending on the outer code) mapped as robust VSB data in the current frame. The twelve preceding bits are for comb filter compensation (see the Guide to the Use of the ATSC digital Television Standard A/54). Accordingly, as shown in FIG. 18, bits $b_6\ \ldots\ b_1$ represent the number G, bits $b_{18}\ \ldots\ b_{13}$ are the complement of bits $b_6\ \ldots\ b_1$, and bits $b_{12}\ \ldots\ b_7$ can be alternating +1 and −1 (or any other pattern).

Let it be assumed that $S=S_{1/4}+S_{1/2}+S_{3/4}$. Because 312/8=39, 0-39 groups of eight segments can be mapped as robust VSB data or 8 VSB data (ATSC data). Therefore, each $S_C$ may have a value of 0 . . . 39, as long as their sum S is ≦39.

The robust VSB data segments are preferably distributed as uniformly as possible over the data frame. For example, if S=1, then the following eight segments are mapped as robust VSB data segments and all other segments are mapped as ATSC data segments: 1, 40, 79, 118, 157, 196, 235, and 274. If S=2, then the following sixteen segments are mapped as robust VSB data segments and all other segments are mapped as ATSC data segments: 1, 20, 39, 58, 77, 96, 115, 134, 153, 172, 191, 210, 229, 248, 267, and 286. These examples continue until S=39, where the whole data frame is mapped as robust VSB data segments. For some values of S, the spacing between robust VSB data segment pairs is not perfectly uniform. However, for any value of S, the spacing is fixed in advanced and, therefore, known to all receivers.

If a frame contains robust VSB data provided by three outer coders operating at ¼ rate, ½ rate, and ¾ rate, then the data from these three outer coders may be divided in a frame such that, as to RVSB segments, the first $8\times S_{1/4}$ segments contain the ¼ rate outer coded data, the next $8\times S_{1/2}$ segments contain the ½ rate outer coded data, and the last $8\times S_{3/4}$ segments contain the ¾ rate outer coded data. However, other robust VSB data segment organizations are possible for these three outer coders or for any number of other types of outer coders.

Because this robust VSB map is contained in the frame sync segment, as discussed above, the robust VSB map does not enjoy the same level of coding gain as the robust VSB data. However, the robust VSB map may still be reliably acquired by a robust VSB receiver by correlating the robust VSB map over some number of frames. Therefore, the robust VSB map should not change too often (or example, not more often than every ~60 frames).

The above mapping method allows a receiver to reliably and simply acquire the robust VSB map by correlation. Once a receiver has acquired the map, it is desirable for the receiver to instantly and reliably track changes in the map. In order to instantly and reliably track changes in the map, the definition in the robust VSB map for each outer code, excluding the comb compensation bits, is duplicated in the first robust VSB Reed/Solomon encoded block of the frame. In addition, there is data indicating (i) when in the future the map will change and (ii) the future new map definition. The first robust VSB data packet of a frame for an outer coder, therefore, has the structure shown in FIG. 17, where the robust VSB map definition data is given by the following: eight bits designating the current map (only six of these bits are used); eight bits designating the number of frames until the map changes (1-125; if 0, then no change coming); and, eight bits designating the next map (again, only six of these bits are used). The remaining portion of the first robust VSB data packet is data. The first RVSB segment in a frame for a respective outer coder has the arrangement shown FIG. 17.

In this way, a receiver can track map changes using reliable robust VSB data. Even if a burst error destroys a number of the frames, the receiver can keep its own frame countdown using the number of frames read from a previously received frame. If the receiver finds at any time that the definition for an outer code previously acquired by the frame sync correlation does not match the definition for that outer code in the first robust VSB data segment, the receiver should restart its map acquisition process.

RVSB Enhanced Slice Prediction and Equalizer Feedback

ATSC 8 VSB receivers make important use of adaptive equalization and phase tracking as explained in the ATSC Digital Television Standard A/53 published by the Advanced Television Systems Committee, in the Guide to the Use of the ATSC Digital Television Standard A/54, also published by the Advanced Television Systems Committee. RVSB as described above has features that allow for improvements in adaptive equalization and phase tracking.

One such improvement results from feeding back delayed reliable estimates of the input symbol level to the adaptive equalizer and/or phase tracker based on a sequence estimation from an enhanced Viterbi Algorithm. (See "The Viterbi Algorithm," G. D. Forney, Jr., Proc. IEEE, vol 61, pp. 268-278, March, 1973). This type of feedback avoids the need for "re-encoding," which has a state initialization problem.

Figure 19:
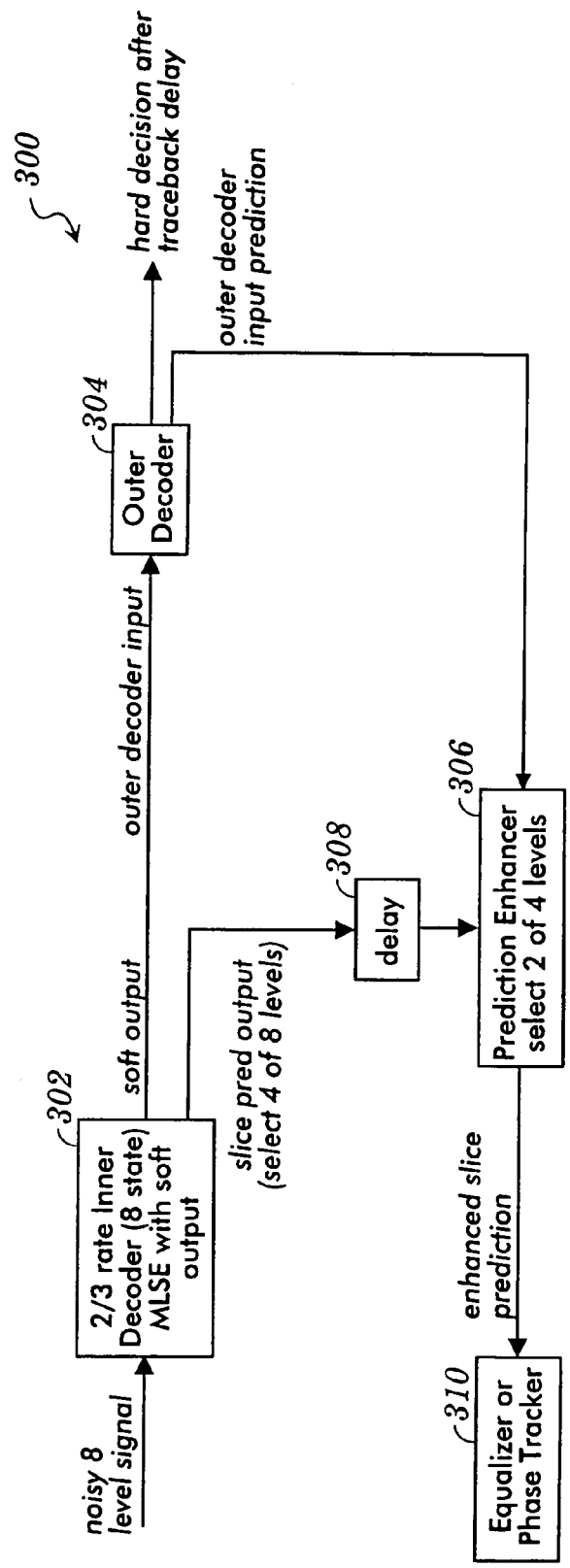
FIG. 19 illustrates an enhanced slice predictor according to one embodiment of the present invention.

U.S. Pat. No. 5,923,711, entitled "Slice Predictor for a Siqnal Receiver," discloses an ATSC 8 VSB receiver which utilizes a slice predictor in order to provide more reliable feedback to the phase tracker or adaptive equalizer. This feedback can be made even more reliable by a enhanced slice predictor system 300 shown in FIG. 19. The enhanced slice predictor system 300 has an inner decoder 302 and an outer decoder 304 which operate similarly to the inner decoders and outer decoders described above.

Figure 20:
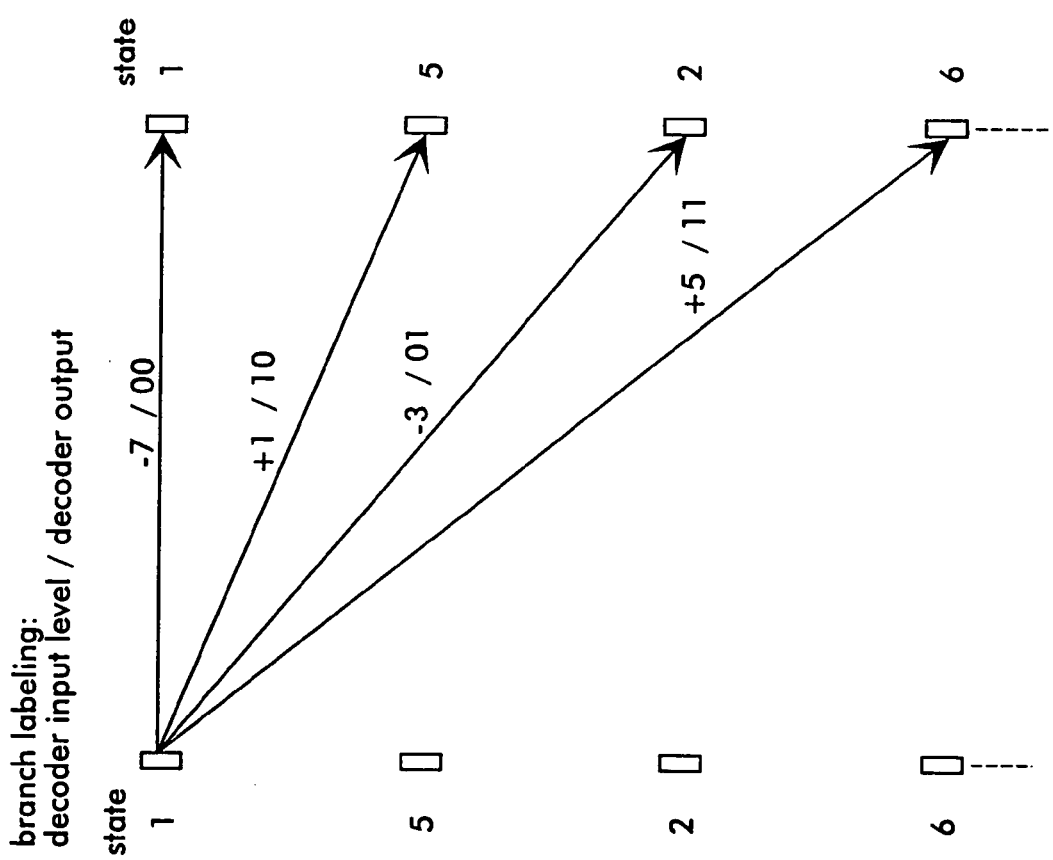
FIG. 20 shows the trellis for the inner decoder of FIG. 19.

The slice-prediction output from the inner decoder 302 works in a manner similar to that described in the aforementioned U.S. Pat. No. 5,923,711. As explained above, the inner decoder 302 is based on an 8 state 4-ary trellis that includes a precoder. Based on the best path metric at the current time t, the slice predictor of the inner decoder 302 decides a most likely state at time t. Then, based on the next possible pair of states, four possible predicted input levels (out of eight) for the next symbol at time t+1 are selected. For example, as shown by the inner decoder trellis in FIG. 20, if the most likely state at time t is state one, the next state is ϵ[1 5 2 6]. Therefore, the next input level at time t+1 may be −7,+1 ,−3 , or +5. These next input levels correspond to decoded bit pairs 00, 10, 01, and 11, respectively.

Figure 21:
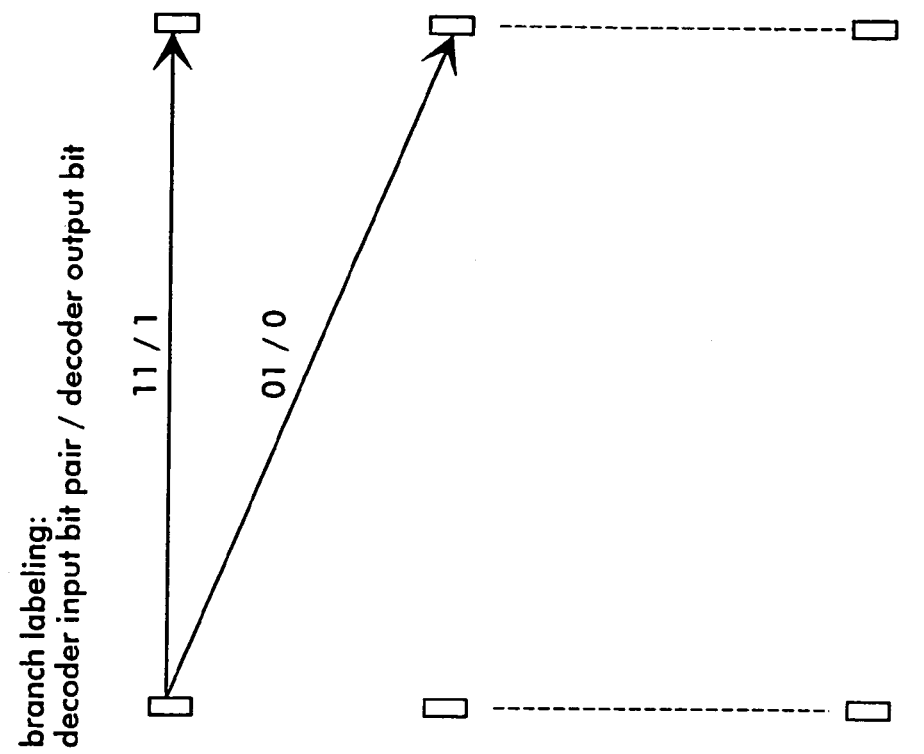
FIG. 21 shows possible state transitions for the outer decoder of FIG. 19.

Similarly, the outer decoder 304 also finds the best path metric for the current time t for the respective trellis. A portion of this trellis is shown in FIG. 21 for an exemplary outer decoder and may be applied generally to all three outer codes. As shown in FIG. 21, two possible outer decoder input bit pairs are selected for the time t+1 based on the next possible pair of states. By way of example, the two possible outer decoder input bit pairs may be 11 or 01. The bit pair chosen by the outer decoder 304 is sent to a prediction enhancer 306 which selects amplitude levels +5 or −3 from the set of four levels previously selected by the slice predictor of the inner decoder 302 as the enhanced slice prediction for time t+1. Because the slice prediction of the inner decoder 302 is near zero delay, but because the outer decoder 304 cannot operate on the same symbol until after the inner decoder 302 has provided a decoded soft output, a delay module 308 provides a delay time slightly greater than the traceback delay time of the inner decoder 302. The slice prediction provided by the prediction enhancer 306 may be supplied as feedback to an equalizer of phase tracker 310.

With some additional delay time, the outer decoder 304 can make a final hard decision and select a single most likely input bit pair for time t+1. For example,if 11 is found to be the most likely input bit pair to the outer decoder 304 as determined by its Viterbi Algorithm, this information is sent by the outer decoder 304 to the prediction enhancer 306 which then chooses +5 from the set of four levels and corresponding bit pairs already selected by the slice predictor of the inner decoder 302. The outer code can be a convolutional code or other type of error correction code. The predictor enhancer 306 is disabled during the periods of time when ATSC data is being received.

Figure 22:
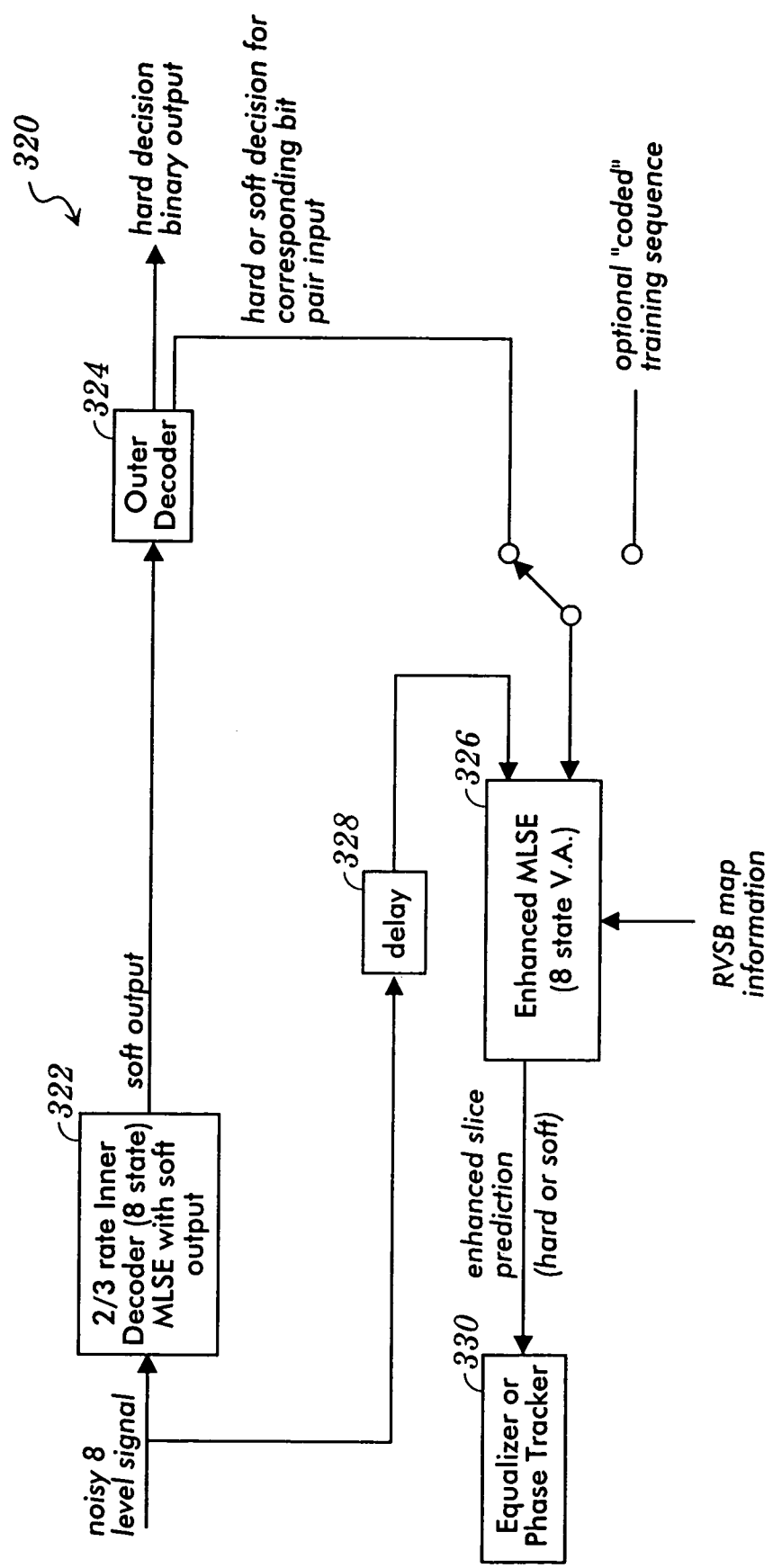
FIG. 22 illustrates an enhanced slice predictor according to another embodiment of the present invention.

A feedback enhanced maximum likelihood sequence estimator (MLSE) slice predictor system 320 uses the Viterbi Algorithm and is shown in FIG. 22 along with other relevant parts of an RVSB receiver. The feedback enhanced MLSE slice predictor system 320 has an inner decoder 322 and an outer decoder 324 which operate similarly to the inner decoder 302 and the outer decoder 304 described above. However, instead of using the slice prediction output of the inner decoder 302, an enhanced MLSE module 326 is configured to execute the usual Viterbi Algorithm on the received signal by operating the eight state ⅔ rate code trellis (the same trellis used by the inner decoder 322, including the precoder).

The enhanced MLSE module 326 selects as its next input either (i) the noisy eight level received signal as delayed by a delay module 328 if the next input is a non-RVSB symbol or (ii) the bit pair decision output of the outer decoder 324 (hard or soft) if the next input is a RVSB symbol. The enhanced MLSE module 326 makes this selection according to the symbol by symbol information in the RVSB map.

The enhanced MLSE module 326 outputs one of eight possible symbols as its slice prediction, and this slice prediction (symbol decision) is provided by the enhanced MLSE module 326 as feedback to an equalizer or phase tracker 330.

The enhanced MLSE module 326 should follow a more correct path through the eight state trellis than does the inner decoder 322 because the enhanced MLSE module 326 gets more reliable input from the outer decoder 324 when an RVSB symbol is available.

The output of the enhanced MLSE module 326 may be a hard slice decision or a soft level. Also, any symbol reliability indication from the inner decoder 322 or the outer decoder 324 may be used to change the step size of the equalizer LMS algorithm. (See the Guide to the Use of the ATSC Digital Television Standard A/54.)

An optional predetermined coded training sequence may be included in a specified portion of the first RVSB segment of a data field. This sequence is known in advance by both the transmitter and receiver. During the time the decoded training sequence is output from the outer decoder 324, the input to the enhanced MLSE module 326 is switched to a stored version of the decoded training sequence.

Certain modifications of the present invention have been discussed above. Other modifications will occur to those practicing in the art of the present invention. For example, although the standard ATSC receiver 12 and the robust VSB receiver 14 are shown above as separate receivers, the functions of the standard ATSC receiver 12 and the robust VSB receiver 14 can be combined in two data paths of a single receiver capable of decoding both types of data (ATSC data and robust VSB data).

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

The invention claimed is:

1. An apparatus comprising:
   a receiver that receives a digital signal, wherein the digital signal contains a frame of first and second 8 Vestigial Sideband (VSB) data symbols having the same constellation, wherein the first and second 8 VSB data symbols correspond to different numbers of data bits, wherein the digital signal further contains a map, wherein the map contains information indicating a location of at least one of the first and second 8 VSB data symbols in the frame;
   a processor that separates the first 8 VSB data symbols according to the location information contained in the map; and,
   a decoder that decodes the separated first 8 VSB data symbols.

2. The apparatus of claim 1 wherein the map contains information indicating one of at least two outer coding rates at which the data corresponding to the first 8 VSB data symbols have been outer coded, and wherein the decoder is arranged to decode the first 8 VSB data symbols based upon the outer coding rate indicated by the map.

3. The apparatus of claim 1 wherein the digital signal contains first and second groups of the first 8 VSB data symbols, wherein the data corresponding to the symbols of the first group have been outer coded at a first rate, wherein the data corresponding to the symbols of the second group have been outer coded at a second rate, wherein the map contains information indicating location of the first and second groups and their respective outer coding rates, and wherein the decoder is arranged to decode the first and second groups based upon their location and the respective first and second outer coding rates indicated by the map.

4. The apparatus of claim 3 wherein the processor is arranged to correlate multiple transmissions of the map.

5. The apparatus of claim 1 wherein the digital signal also contains data indicating when in the future the map will change.

6. The apparatus of claim 1 wherein the digital signal also contains a new map containing information indicating a location of the first and second 8 VSB data symbols in a future frame.

7. The apparatus of claim 6 wherein the digital signal also contains data indicating when in the future the new map will indicate the location of the first and second 8 VSB data symbols.

8. The apparatus of claim 1 wherein the apparatus is arranged to maintain a count related to when the map will change and to countdown from the count based upon frame times.

9. The apparatus of claim 1 wherein the frame contains m data segments, wherein the map designates the location of a predetermined plurality of the data segments, wherein the processor locates the first 8 VSB data symbols in the predetermined segments, and wherein m is an integer greater than 1.

10. The apparatus of claim 1 wherein the processor discards the second VSB data and processes the first 8 VSB data.

11. The apparatus of claim 1 wherein the first 8 VSB data symbols are robust VSB data symbols, and wherein the second 8 VSB data symbols are ATSC data symbols.

12. The apparatus of claim 1. wherein the first 8 VSB data symbols are ATSC data symbols, and wherein the second 8 VSB data symbols are robust VSB data symbols.

13. The apparatus of claim 1 wherein the map comprises a current map, wherein the frame comprises first and second fields each having a frame sync segment and a plurality of data segments, wherein the first field contains the current map and count information, wherein the second field contains a next map and count information, wherein the current map indicates location of the first 8 VSB data symbols in a current frame, wherein the next map indicates location of the first 8 VSB data symbols in a future frame, wherein the count information indicates the number of frames until the next map becomes the current map, and wherein the processor separates the first 8 VSB data symbols in the current frame according to the current map.

14. The apparatus of claim 13 wherein the current map and count information are contained in the same segment of the first field, and wherein the next map and count information are contained in the same segment of the second field.

15. The apparatus of claim 13 wherein the apparatus maintains a count related to when the next map will change to the current map and counts down from the count based on frame times.

16. The apparatus of claim 15 wherein the current map and count information are contained in the same segment of the first field, and wherein the next map and count information are contained in the same segment of the second field.

17. The apparatus of claim 13 wherein the current map further indicates a coding rate for the data corresponding to the first 8 VSB data symbols in the current frame, and wherein the next map further indicates a coding rate for the data corresponding to the first 8 VSB data symbols in the future frame.

18. The method of claim 13 wherein the current map further indicates first and second coding rates for the data corresponding to the first and second 8 VSB data symbols in the current frame, and wherein the next map further indicates first and second coding rates for the data corresponding to the first and second 8 VSB data symbols in the future frame.

* * * * *